United States Patent
Leedham et al.

(10) Patent No.: US 10,891,226 B1
(45) Date of Patent: Jan. 12, 2021

(54) VIRTUAL ADDRESS SPACE DUMP IN A COMPUTER SYSTEM

(71) Applicant: International Business Machines Corporation, Armonk, NY (US)

(72) Inventors: Neil William Leedham, Bursledon (GB); Adam G. Giounas, Edinburgh (GB); Matthew Sunley, Allbrook (GB); Sean John Cawood, Eastleigh (GB)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/529,147

(22) Filed: Aug. 1, 2019

(51) Int. Cl.
G06F 3/06 (2006.01)
G06F 12/02 (2006.01)
G06F 11/30 (2006.01)
G11C 11/56 (2006.01)

(52) U.S. Cl.
CPC ......... *G06F 12/0246* (2013.01); *G06F 3/067* (2013.01); *G06F 3/0608* (2013.01); *G06F 3/0638* (2013.01); *G06F 3/0646* (2013.01); *G06F 11/3037* (2013.01); *G11C 11/5628* (2013.01); *G11C 11/5642* (2013.01); *G06F 2201/815* (2013.01); *G11C 2211/5646* (2013.01)

(58) Field of Classification Search
None
See application file for complete search history.

(56) References Cited

U.S. PATENT DOCUMENTS

| 9,043,271 | B2 | 5/2015 | Patterson |
| 9,298,536 | B2 | 3/2016 | Buendgen |
| 10,019,327 | B1* | 7/2018 | Backensto ......... G06F 11/1448 |
| 2011/0225458 | A1 | 9/2011 | Zuo |
| 2017/0054824 | A1* | 2/2017 | Friedman ............ G06F 3/0656 |

FOREIGN PATENT DOCUMENTS

CN 104408132 A 3/2015

OTHER PUBLICATIONS

"IBM IZ76606: Document Usage of Fork/Abort to Generate Linux Coredumps", IBM Support, Modified date: Jun. 9, 2010, 3 pages, <http://www-01.ibm.com/support/docview.wss?uid=swg1IZ76606>.
Mell et al., "The NIST Definition of Cloud Computing", National Institute of Standards and Technology, Special Publication 800-145, Sep. 2011, 7 pages.

* cited by examiner

*Primary Examiner* — Brian R Peugh
(74) *Attorney, Agent, or Firm* — Edward Li

(57) ABSTRACT

A method, computer system, and computer program product for operating a computer system to carry out a data dump of a data image of memory contents. Computer operations are temporarily suspended to service the dump request in order to dump the volatile memory contents required for the data image and to generate a record of the non-volatile memory pages which need to be dumped. Computer operations are then resumed under supervision of a monitoring process which screens access requests to the non-volatile memory against the dump record. A request relating to a page contained in the dump record is acted upon by writing the contents of that page to the dump storage space, so the page contents is dumped before it is modified. The dump record in continually updated to keep track of what is still outstanding to complete the dump until such time as the dump is complete.

20 Claims, 9 Drawing Sheets

STAGE 1/2

VIRTUAL ADDRESS SPACE DUMP IN A COMPUTER SYSTEM

BACKGROUND

The present invention relates generally to a computer system and corresponding method for performing a virtual address space dump.

The concept of a virtual address space is common to many computing systems. Processes running on the computing systems can access a virtual storage address space, which is only limited in size by the addressing limitations of the processor architecture. The processor architecture utilizes a central processing unit (CPU) or a group of CPUs, each CPU having a plurality of registers for performing designated tasks under instruction from the computer code. The virtual address space is much larger than the physical core memory available to the processor, so data is moved in and out of the physical core memory as required. The data is moved in data units called pages. The pages are saved in offline storage such as a direct-access storage device (DASD) when not needed. The physical core memory has lower latency, whereas the offline storage has higher latency. The memory may also comprise a more complex multi-tiered hierarchy of several latency levels.

In a computer system, it may become necessary to perform a dump of the entire virtual address space. For example, performing a dump of the entire virtual address space may be necessary, if there is a software problem of some kind. The dump is then performed so that the problem can later be diagnosed to establish the cause of the error. The memory dump dataset is referred to as a data image, or image for short. The act of taking such a dump is extremely resource intensive and may severely impact the overall system performance. In particular, if the dump is taken when the system is already working close to peak capacity, the act of taking the dump can have crippling consequences. Incoming work cannot be efficiently serviced while the dump is being performed, resulting in unacceptably slow responses. In some cases, these slow responses will cause the requesting processes and/or other processes to time-out, which may cause further dumps and re-submission of the dump requests, so adding further to the workload. In a worst case, the load on the system can build up to such an extent that its resources, such as memory, are exhausted causing further failures from which the system may never recover.

FIG. 1 is a schematic drawing of a conventional data dump from a computer system which uses virtual addressing. The virtual address space of the computer system comprises a mixture of physical core memory, labeled volatile, disk storage, and labeled non-volatile. The disk storage hosts a virtualized address space 34 stored by a plurality of virtualized disks 132-1, 132-2 etc., such as storage area networks (SANs). The pages of data are stored across both the volatile and non-volatile memory. The physical core memory 32 may comprise, for example, random access memory (RAM), some of which may be cache memory, and may be directly physically addressed by, and functionally associated with, a processor or processor cluster, labeled CPU (central processing unit) 22. The physical core memory may be used to store some pages and also some other data units, such as operating system data or applications program data. The CPU 22 in turn comprises a plurality of registers, which themselves store data relating to their instantaneous state during use. Units of register data are shown with horizontally striped boxes, units of data in the physical core memory are labelled with cross-hatched boxes, and units of page data in the disk storage are labeled with diagonally striped boxes.

A system dump involves saving the entire contents of the virtual address space for later analysis, referred to as a dump dataset. This involves all data units in the virtual address space, whether in volatile or non-volatile memory, being written to a separate storage space of some kind. Specifically, the physical core memory needs to read the register contents and the non-volatile memory contents with read operations, and save these contents as well as its own contents with write operations to the dump storage as schematically illustrated. Dumping the pages and other data units that are currently in physical core memory and in the CPU registers is relatively fast and has an acceptable impact on performance. However, dumping the pages and any other data units currently held offline in non-volatile memory is much slower, due to the longer access time for read access to offline devices and the greater number of pages stored there. Consequently, taking a full system dump can take a long time, often several seconds.

Because of the time needed to take a system dump, they are sometimes even deliberately disabled, so that vital diagnostic information is never captured.

SUMMARY

In one aspect, a computer-implemented method for operating a computer system to carry out a data dump of a data image of memory contents is provided. The computer system has a volatile memory and also has, or has access to, a non-volatile memory. The volatile memory and the non-volatile memory are indexed by the computer system with a virtualized address space made up of pages. The computer-implemented method includes, in response to receipt of a data dump request to record a data image, suspending operations of the computer system that results in the data image being corrupted. The computer-implemented method further includes writing to a dump storage a subset of the pages required for the data image, including at least volatile memory contents of the data image. The computer-implemented method further includes preparing a record of the pages in the virtualized address space whose contents is still to be written to the dump storage as part of the data image. The computer-implemented method further includes resuming operations of the computer system under supervision of a monitoring process, wherein the monitoring process includes checking page requests to access non-volatile memory to trap any ones that relate to a page contained in the record which is still to be written to the dump storage, and upon such a trap ensuring contents of the page is written to the dump storage space before any modification occurs, and wherein the monitoring process further includes continually updating the record to keep track of which pages are still to be written to the dump storage.

The computer-implemented method thus leverages the fact that a virtual address space requires paging, by watching page retrievals in order to provide advance notification of any potential changes to the virtual memory with minimal overhead. The monitoring process is thus efficient, since it takes advantage of the existing page processing which is inherent to operation of a virtual address space. Storage is paged-in and paged-out between primary core memory and non-volatile storage in page chunks which are watched by the monitoring process. It will be understood that, once the data image in its entirety has been saved on the dump storage, the monitoring process can be stopped, i.e. the supervision of normal operation can cease. In some implementations, the record is updated each time the contents of an address in the record has been written to the dump storage. The record thus keeps track of what is still to be written to the dump storage until the data dump of the data image is complete.

In one type of implementation, when a computer operation involves a read request to a page in the record that is still to be written to the dump storage, the computer-implemented method proceeds by reading the page from the non-volatile memory into the volatile memory, writing contents of the page to the dump storage, and updating the record.

In another type of implementation, when a computer operation involves a write request to a page in the record that is still to be written to the dump storage, the computer-implemented method proceeds by reading the page from the non-volatile memory into the volatile memory, and then writing contents of the page to the dump storage before overwriting the page in fulfillment of the write request, and updating the record.

The computer system includes a processor with registers and the contents of the registers may also be saved to the dump storage, by writing the register contents to the dump storage during the temporary suspension of normal operations.

The monitoring process may further comprise progressing the data dump by incrementally reading pages logged in the record from non-volatile memory and writing their contents to the dump storage. This incremental reading and writing takes place in parallel with trapping of page access requests. The incremental reading from non-volatile memory and writing to the dump storage may be carried out at a rate determined by application of a policy, wherein the policy may include at least one factor relating to computer system performance and/or at least one factor relating to speed of completion of the data dump. The policy can thus take account of the conflicting requirements of wishing to complete the data dump as quickly as possible while also not wishing that the data dump overly compromises system performance. The incremental reading from non-volatile memory and writing to the dump storage may be carried out at a rate sufficient to ensure that the data dump of the data image is completed within a target time. The target time may be a time span starting from when the dump request was raised, or an absolute time in the future, e.g., a certain time of day. The target time may be determined from, for example, the time of receipt of the data dump request, or a timestamp that is associated with the data dump request. The incremental reading from non-volatile memory and writing to the dump storage may be carried out at a rate adjusted with reference to a computer system performance criterion. For example, the rate may be adjusted according to a loading factor that measures the system performance, so that the writing of the remaining pages of the image data is halted or slowed if the loading factor exceeds a threshold value.

In some cases, the data dump request may be specific to a particular computer application running on the computer system, in which the method may be carried out by identifying, during the temporary suspension, those addresses in non-volatile memory that are specific to the computer application, so that the record only need contain those specific addresses.

The non-volatile memory may comprise a lower latency portion which is part of the computer system and a higher latency part which is external to the computer system.

There are various options for configuring the dump record. For example, the record may be made up by setting a plurality of page-specific flags, each flag being unset when the contents from that page have been written to the dump storage.

In another aspect, a computer program product for operating a computer system to carry out a data dump of a data image of memory contents is provided. The computer system has a volatile memory and also has, or has access to, a non-volatile memory. The volatile memory and the non-volatile memory are indexed by the computer system with a virtualized address space made up of pages. The computer program product comprises one or more computer-readable tangible storage devices and program instructions stored on at least one of the one or more computer-readable tangible storage devices. The program instructions are executable to suspend operations of the computer system that results in the data image being corrupted, in response to receipt of a data dump request to record a data image. The program instructions are further executable to write to a dump storage a subset of the pages required for the data image, including at least volatile memory contents of the data image. The program instructions are further executable to prepare a record of the pages in the virtualized address space whose contents is still to be written to the dump storage as part of the data image. The program instructions are further executable to resume operations of the computer system under supervision of a monitoring process, wherein the monitoring process includes checking page requests to access non-volatile memory to trap any ones that relate to a page contained in the record which is still to be written to the dump storage, and upon such a trap ensuring contents of the page is written to the dump storage space before any modification occurs, and wherein the monitoring process further includes continually updating the record to keep track of which pages are still to be written to the dump storage.

In yet another aspect, a computer system for operating a computer system to carry out a data dump of a data image of memory contents is provided. The computer system comprises one or more processors, one or more computer readable tangible storage devices, and program instructions stored on at least one of the one or more computer readable tangible storage devices for execution by at least one of the one or more processors. The computer system comprises a volatile memory and a non-volatile memory. The computer system comprises a data controller operable to manage virtualized address space made up of pages within the volatile and non-volatile memories, and the data controller comprises an agent operable to carry out a data dump of a data image of memory contents responsive to receipt of a data dump request. The agent is configured to suspend operations of the computer system that results in the data image being corrupted, in response to receipt of a data dump request to record a data image. The agent is further configured to write to a dump storage a subset of the pages required for the data image, including at least volatile memory contents of the data image. The agent is further configured to prepare a record of the pages in the virtualized address space whose contents is still to be written to the dump storage as part of the data image. The agent is further configured to resume operations of the computer system under supervision of a monitoring process, wherein the monitoring process includes checking page requests to access non-volatile memory to trap any ones that relate to a page contained in the record which is still to be written to the dump storage, and upon such a trap ensuring contents of the page is written to the dump storage space before any modification occurs, and wherein the monitoring process further includes continually updating the record to keep track of which pages are still to be written to the dump storage.

BRIEF DESCRIPTION OF THE DRAWINGS

In the following, the present invention will further be described by way of example only with reference to exemplary embodiments illustrated in the figures.

DETAILED DESCRIPTION

In the following detailed description, for purposes of explanation and not limitation, specific details are set forth in order to provide a better understanding of the present disclosure. It will be apparent to one skilled in the art that the present disclosure may be practiced in other embodiments that depart from these specific details.

Before describing an embodiment of the disclosure, we first describe suitable hardware, software and network components of a computer system suitable for implementing embodiments of the disclosure.

Figure 1:
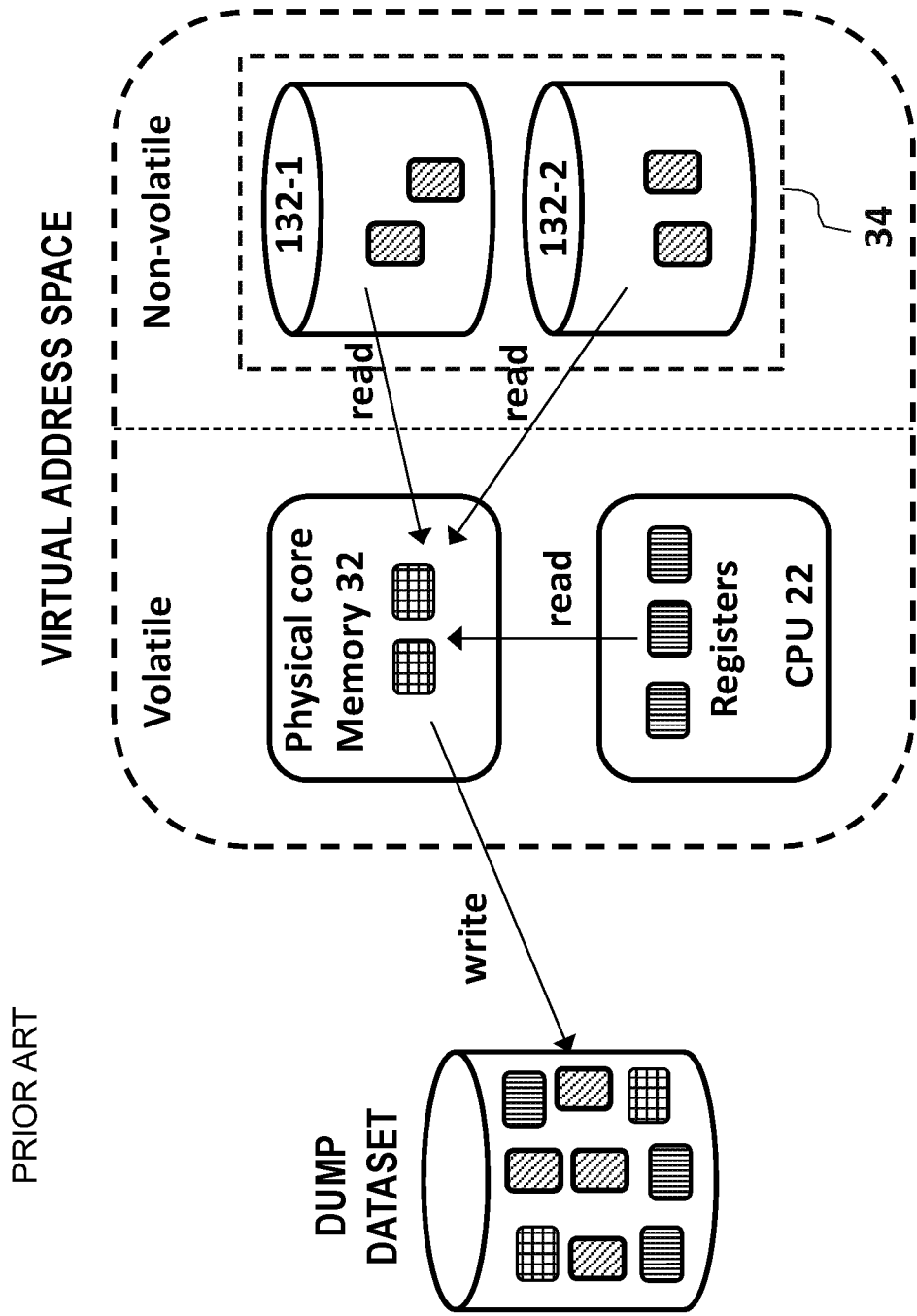
FIG. 1 a schematic drawing of a data dump from a computer system with a virtualized address space as performed conventionally.
Figure 2:
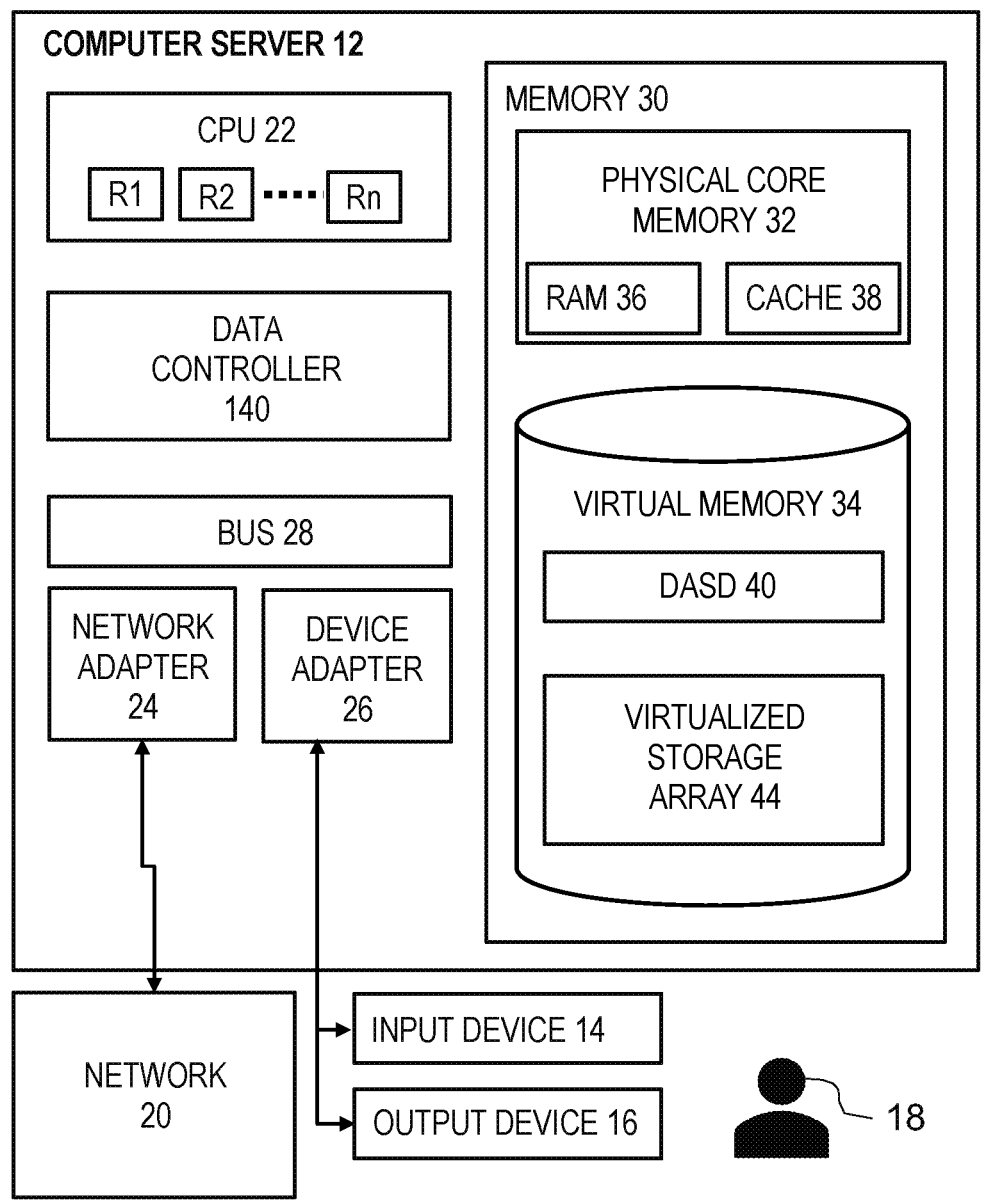
FIG. 2 is a block diagram showing an example, a conventional server computer system with a virtualized address space.

FIG. 2 is a block diagram showing a server computer system 12, or server for short, which uses virtual addressing. Suitable servers may be, or include, personal computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above.

The server 12 may be described in the general context of computer readable instructions, such as program modules, being executed by a computer processor. Generally, program modules may include routines, programs, objects, components, logic, and data structures that perform particular tasks or implement particular abstract data types. The server 12 may be embodied in distributed cloud computing environments where tasks are performed by remote processing devices that are linked through a communications network. In a distributed cloud computing environment, program modules may be located in both local and remote computer system storage media, including memory storage devices.

The server 12 is operable by a user 18 and includes a central processing unit (CPU) 22, a memory 30, a data controller 140, a network adapter 24, and a device adapter 26, which are in communication with each other via a server bus 28. The server 12 may be in communicative connection with an external network 20 via the network adapter 24 and with external or internal input and output devices 14 and 16 via the device adapter 26. The network adapter 24 is connected to the server bus 28 and the network 20 for enabling communication between the server 12 and devices on the network 20. The device adapter 26 is connected to the bus 28, and the input and output devices 14 and 16 for enabling communication between the server 12, the input devices 14, and the output devices 16. The bus 28 couples the main system components together, including the memory 30 and the CPU 22. The bus 28 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

The CPU 22 is operable to load machine readable instructions from the memory 30 and to perform machine operations using a set of registers R1, R2 . . . . Rn according to the instructions. Such machine operations include, for example, incrementing or decrementing a value in a register, transferring a value from memory 30 to a register or vice versa, branching to a different location, i.e. physical, address, in memory if a condition is true or false (also known as a conditional branch instruction), and adding or subtracting the values in two different registers and loading the result in another register. A typical CPU can perform many different machine operations. A set of machine instructions is called a machine code program, the machine instructions are written in a machine code language, which is referred to a low level language. A computer program written in a high level language needs to be compiled to a machine code program before it can be run. Alternatively a machine code program such as a virtual machine or an interpreter can interpret a high level language in terms of machine operations.

The server 12 and specifically the CPU 22 has access to the memory 30 using a virtual address space. The memory 30 may be subdivided into a physical core memory 32 and a virtual memory 34. The physical core memory 32 is on-chip. The physical core memory 32 may include random access memory (RAM) 36 and cache memory 38, as well as read only memory (ROM). The virtual memory 34 is of higher latency than the physical core memory 32 and, while addressable by the server 12, is at least for the most part physically separate from the server 12, e.g., connected to the central processing unit 22 via higher latency bus or network connections, rather than being on-chip or on-board with the server 12. The virtual memory 34 generally has a much larger capacity than the physical core memory 32 available to the processor, so data is moved in and out of physical core memory 32 as required in data units, typically of fixed size, called pages, and saved 'offline' in the higher latency virtual memory 34. The virtual memory 34 may for example include a DASD 40 and a virtualized storage array 44. The server 12 includes a data controller 140 which manages the virtualization of the address space. The virtual address space encompasses the memory that can be used by the processes running inside it. The physical core memory 32 and the virtual memory 34 therefore both lie within the virtual address space for the purposes of those processes.

The server 12 may have installed thereon a plurality of program modules configured to provide distinct computing activities, such as a database, applications software, firmware, a bootstrap program, an operating system, and support applications. Each of the operating system, support applications, other program modules, and program data, or some combination thereof, may include an implementation of a networking environment. The server 12 is arranged in operative communication with at least one network 20 (e.g., a local area network (LAN), a general wide area network (WAN), or a public network like the Internet) via the network adapter 24. The network adapter 24 communicates with the other components of the server 12 via the bus 28. It should be understood that, although not shown, other hardware or software components could be used in conjunction with server 12. Examples include, but are not limited to, microcode, device drivers, redundant processing units, external disk drive arrays, redundant array of independent disks (RAID), tape drives, and data archival storage systems.

Figure 3:
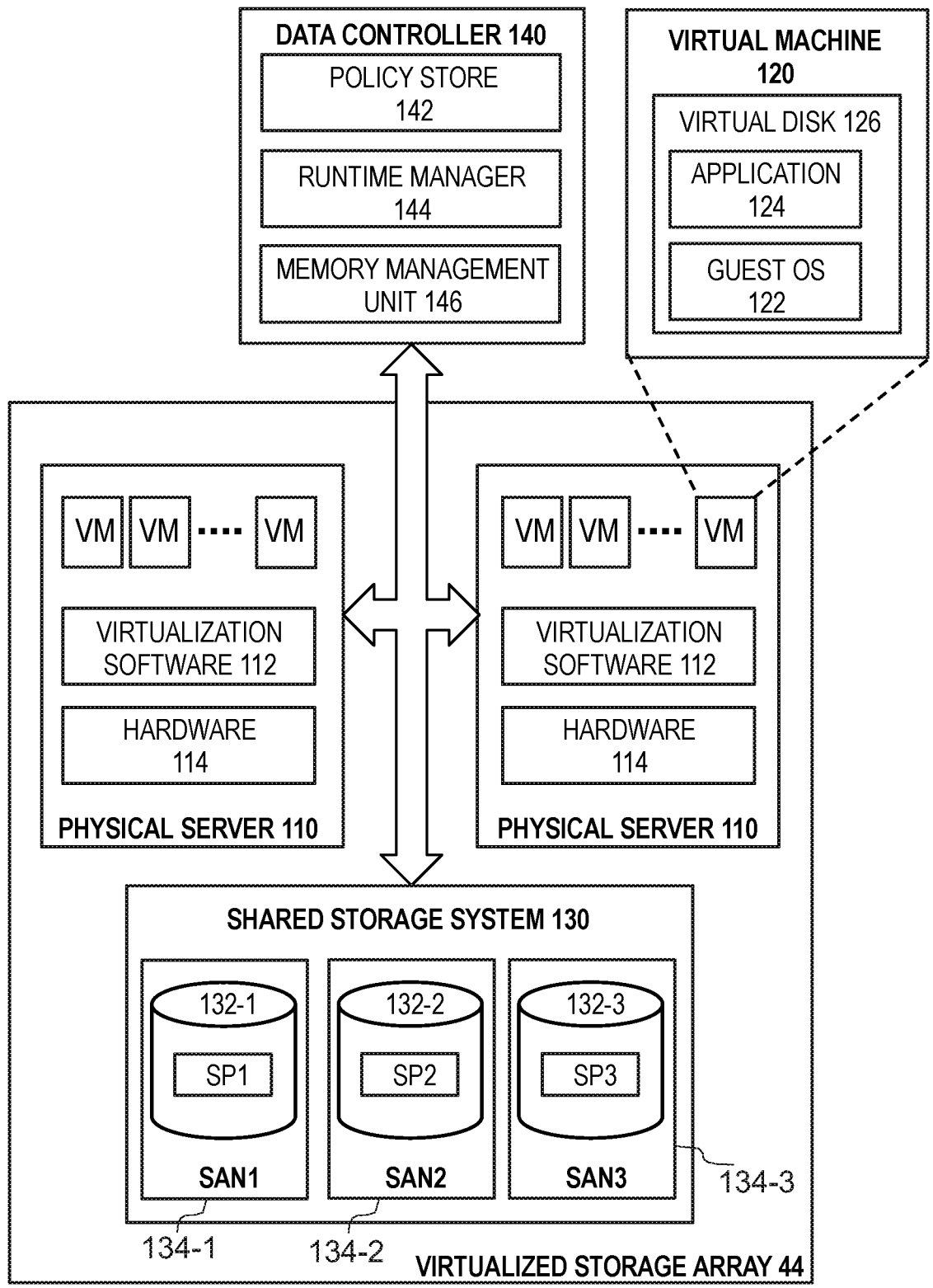
FIG. 3 a block diagram showing details of how the virtualized address space of FIG. 2 may be realized.

FIG. 3 is a block diagram showing details of the virtualized storage array 44 shown in FIG. 2, as managed by the data controller 140 also shown in FIG. 2. The virtualized storage array 44 includes physical storage devices in the form of physical servers 110 that each execute virtualization software 112 (e.g., hypervisor) and include suitable hardware 114 to support multiple virtual machines 120. The data controller 140 provides management for the virtualization and includes: a policy store 142; virtual machine provisioning via a runtime manager 144; and a memory management unit 146, whose role it is to manage page tables used to translate the virtual addresses seen by the application into physical addresses used by the hardware to process instructions. The user devices 150 may be operated by any suitable users, such as system administrators, organization administrators, database users, application developers and/or system architects. The virtualization software 112 maintains a mapping between virtual resources and physical resources of physical server 110, such as CPU resources (e.g. processors), memory resources (e.g. random access memory) and network resources (e.g. access networks). Virtual machines 120 are also provisioned with storage resources, such as a shared storage system 130 having multiple datastores 132-1, 132-2 and 132-3 which are collectively referred to as datastore 132.

The term "datastore" may broadly refer to a logical container that hides specifics of the underlying storage resources to provide a uniform model for storing virtual machine data. The datastores 132-n may each represent a formatted file system that physical servers 110 mount and share. The file system may be a cluster file system that supports virtualization, for example, such as Virtual Machine File System (VMFS) and Network File System (NFS) provided by network attached storage (NAS). The term "datastore" may also refer to one or more storage pools that each represents a logical slice of datastore 132. In the example in FIG. 3, datastores 132-1 to 132-3 are illustrated as each including one storage pool, labeled "SP1", "SP2" and "SP3", respectively.

In practice, the datastores 132 on the shared storage system 130 may have different capabilities defined in terms of capacity, I/O capability, disk format etc. For example, the shared storage system 130 may include multiple storage devices (e.g., see 134-1 to 134-3) of any suitable technology, such as storage area networks (SAN) and NASs. SAN devices generally use access protocols such as Internet Small Computer System Interface (iSCSI) and fiber channel to provide block level access to storage resources. On the other hand, NAS devices generally support file-based protocols such as NFS to provide shared file-level access to storage resources. The datastores 132 on the shared storage system 130 may also in some embodiments refer to local storage, in particular storage-rich servers, such as in hyperconverged systems.

In the example illustrated in FIG. 3, the shared storage system 130 includes three SAN devices on which the datastores 132-n are located, i.e., datastore "SP1" on "SAN1", datastore "SP2" on "SAN2" and datastore "SP3" on "SAN3". Although only SAN devices are shown in FIG. 3 for simplicity, the shared storage system 130 may include NAS devices, or a combination of SAN and NAS devices. Depending on the characteristics of the underlying storage devices, datastores 132 may be used for different storage purposes.

Each virtual machine 120 may support a guest operating system 122 and at least one application 124 (e.g., a database instance). When creating the virtual machine 120, a certain amount of storage resource is allocated to the virtual machine 120. In particular, a virtual disk 126 is created for virtual machine 120 to store data (e.g., files) for the virtual machine 120. The term "virtual disk" may generally refer to an entity that appears to the guest operating system 122 as a single disk.

A virtual disk 126 may be used by a virtual machine 120 to store different types of data, such as data relating to (guest) operating systems, data for applications, database data, database log data and backup data. At a chosen tier of the virtualization, different ones of the virtual disks may be created for storing data of each data type (e.g. a backup data disk, an OS data disk) and a single virtual machine 120 will run multiple ones of such virtual disks 126.

The process of deciding the mapping between physical and virtual storage, i.e., mapping between datastores 132-n and virtual disks 126 of virtual machine 120 is known as "data placement" or just "placement". Placement may be determined when the virtual machine 120 is created during provisioning, or when an additional virtual disk is added to an existing virtual machine. Completing the placement process results in a given virtual disk residing on, and its data stored on, one or more of the datastores 132-n.

The data placement process is carried out in the data controller 140 by the runtime manager 144 following data placement policies stored in the policy store 142. The data placement policies are specified in such a way that data placement can be fully automated, although it may be useful to allow the option of some element of manual intervention by a user with system administrator rights.

An embodiment of the disclosure is now described.

Figure 4:
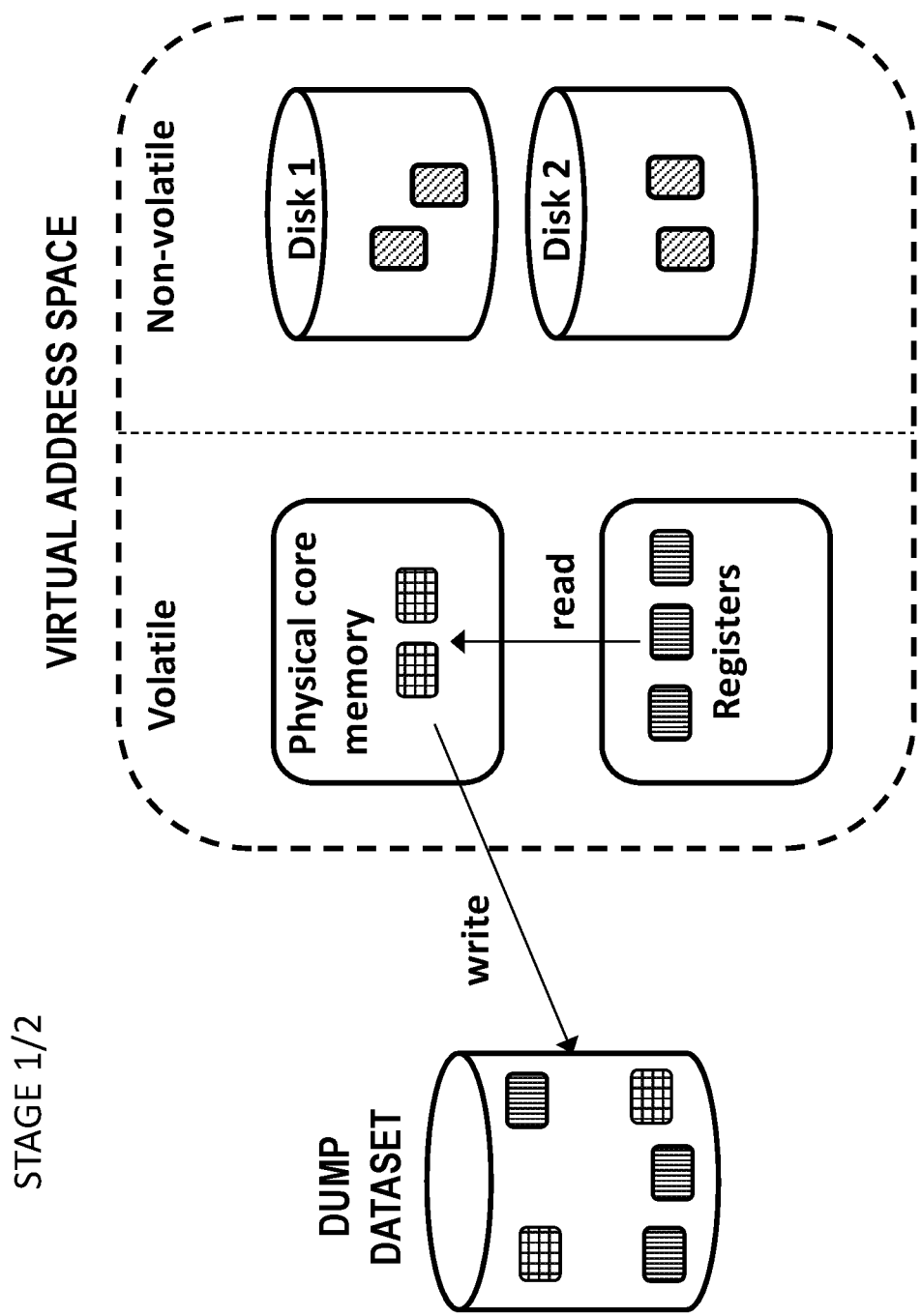
FIG. 4 shows initial stages of a data dump from a computer system with a virtualized address space, in accordance with one embodiment of the present invention.
Figure 5:
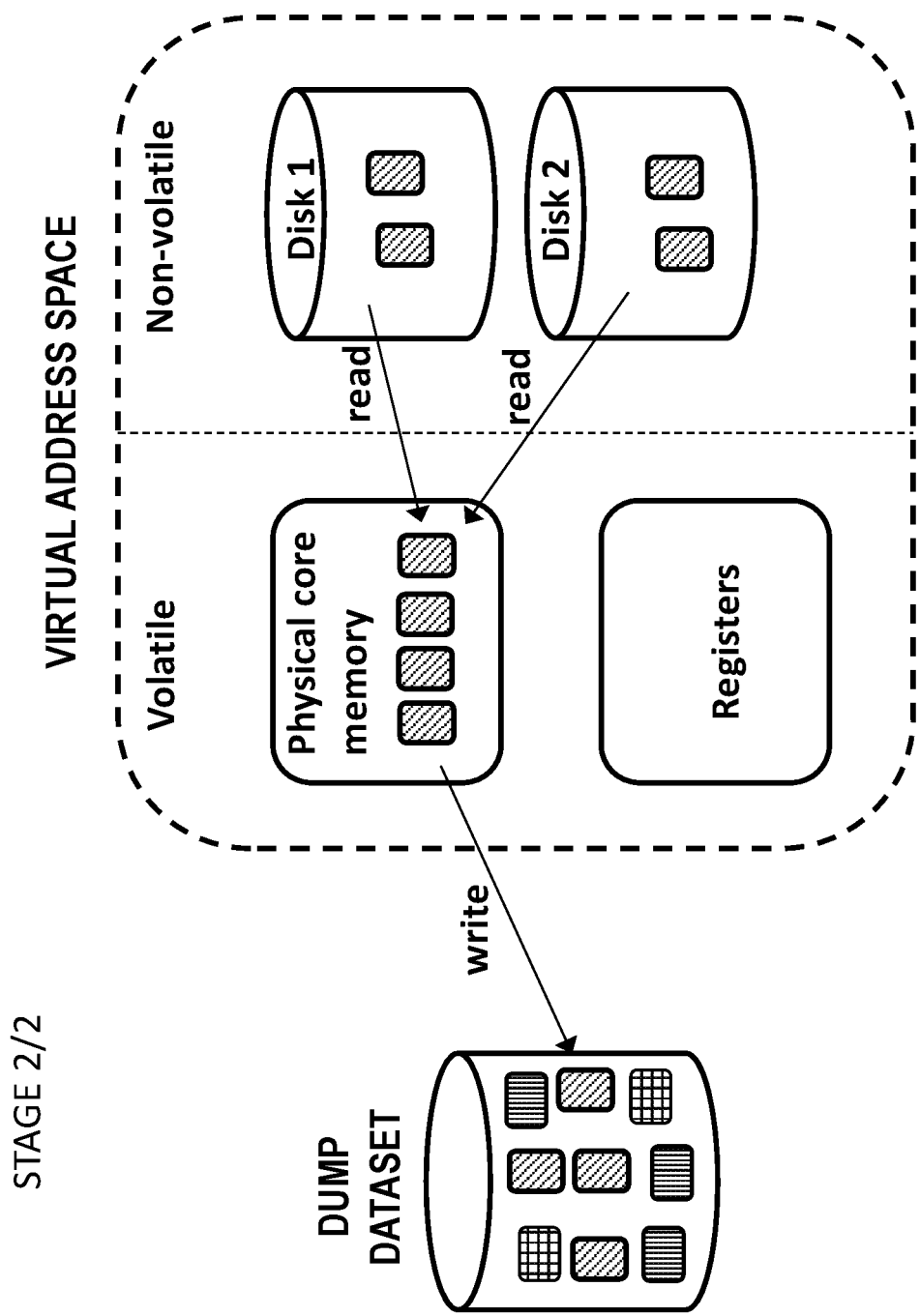
FIG. 5 shows subsequent stages of a data dump from a computer system with a virtualized address space, in accordance with one embodiment of the present invention.

FIG. 4 shows initial stages of a data dump from a computer system with a virtualized address space, in accordance with one embodiment of the present invention. FIG. 5 shows subsequent stages of a data dump from a computer system with a virtualized address space, in accordance with one embodiment of the present invention. Units of register data are shown with horizontally striped boxes, units of data, which are pages, in the physical core memory are labelled with cross-hatched boxes, and units of data in the disk storage, which are pages, are labeled with diagonally striped boxes. As shown schematically, the memory used for the virtual address space is subdivided into volatile memory and non-volatile memory which we define as follows.

We define volatile memory as including not only memory units which will lose their contents if power is lost, i.e., the conventional hardware definition of volatile memory, but also memory units whose contents is managed by the operating system or other control software in such a way that the contents of such memory units is unpredictable, so the data stored in such memory units may be lost, e.g., by being overwritten, at any time without prior notification.

We define non-volatile memory, by inference, as all memory that does not fall with our above definition of volatile memory. In particular, we define non-volatile memory as memory whose contents is preserved on loss of power and whose contents is subject exclusively to predictable change processes. In addition, a further characteristic of non-volatile memory and its contents is that the operating system or other relevant control software is configured such that it is a requirement of a change-process relating contents of a non-volatile memory unit that the contents of that unit must be retrieved from non-volatile memory into volatile memory before the contents of that non-volatile memory unit are permitted to be changed.

In the context of the present disclosure this means that, while it is imperative that data in volatile memory is captured immediately after issuance of a backup request to ensure that the dump is accurate and complete, the data in non-volatile memory need not be captured immediately provided that the computer system keeps a record of which non-volatile memory units need to be dumped and in the meantime while they are still waiting to be dumped prevents those non-volatile memory units from having their contents overwritten or otherwise altered in the course of normal operations.

The process that is now described discloses how to implement a dump that follows this concept. In the embodiment, volatile memory comprises CPU registers and physical core memory, and non-volatile memory comprises disk storage. Moreover, a unit of non-volatile memory is referred to as a page. When a dump request is first made, the contents of registers and physical core memory are recorded immediately, but the recording of pages which are currently held offline is staggered to reduce the performance impact. The contents of these offline pages will remain unchanged, exactly the same as when the dump request was made, until such time as they are updated. However, as a precursor to any page update, that page will be loaded into the physical core memory by a read command. Watching for page loads of pages that have not yet been dumped thus enables any page to be dumped to the dump dataset before it is altered. All that is needed is that, when a dump request is raised, a record of the pages in non-volatile memory that need to be dumped is created. This record is then updated as the dumping proceeds to keep track of which pages are still to be dumped to complete the dump dataset. The 'before image' of each relevant page can thus be recorded to the dump data set at the latest the first time, subsequent to the dump request being raised, that the relevant page is loaded during normal operation of the system.

The dump record may contain those pages already dumped and those which are still outstanding, or may just contain the outstanding pages. In addition to dumping pages which are incidentally accessed during normal operation as described above, in parallel other outstanding pages are loaded and dumped according to a user specified policy, to be implemented by a dump worker process. The policy could specify, for example, that outstanding pages should be dumped as quickly as possible, subject to the overall system performance not dropping below a particular level, or that the dump should be completed within a certain absolute amount of time or by a certain time of day.

The method is initiated by a dump request. The dump request results in normal operation being halted for a limited amount of time to allow the following actions to take place. The data in the registers and physical core memory is written to the dump data set. This will involve writing the physical core memory contents to the data dump set. This will also involve loading the register contents into the physical core memory and writing the register contents to the data dump set. These initial actions ensure that all data is saved that does not persist anywhere in non-volatile memory, thus saving all data that is liable to change without notice in the course of normal operation. Since the volatile data will in general be a relatively small amount of data and since this data is available to the computer system without any I/O reads from non-volatile memory, writing this data to the dump data set has minimal, or at least very low, cost to the computer system.

While normal operation is temporarily halted, the computer system also generates a record of those pages of data in the non-volatile memory that need to be written to the dump data set to service the dump request. This involves identifying those pages of data that are pertinent to the application(s) being dumped which have not already been captured by the writing from physical core memory. For example, these pages could be identified by seeing which ranges or blocks of virtual storage addresses are applicable to an application. The dump record would then save these and set a flag for each such page to show if the page is still to be dumped.

Once these two synchronous processing actions are complete, i.e., the volatile data has been dumped to the dump dataset and the record of the non-volatile memory pages to be dumped has been generated, normal operation of the computer system can be resumed under supervision of a monitoring process which manages how the dump of the non-volatile data is completed in the background. In particular, the monitoring process ensures that the pages that are still to be dumped are not accidentally altered, e.g. by overwriting, before they are dumped.

The monitoring process checks requests to access pages in non-volatile memory to trap requests to read any page that is contained in the dump record, i.e., any page which is still to be written to the dump storage. If such a page is retrieved from the non-volatile memory into the physical core memory in the course of normal operation, the monitoring process ensures that it is written to the dump data set before any operation takes place that could alter its contents. The flag in the dump record for this page can then be unset.

While the entire dump could in principle proceed in this way, this is likely to be undesirably slow in most practical cases. Undesirably, it would also take an unpredictable amount of time to complete, since the dump would not be completed until every one of the pages in the dump record had been loaded into physical core memory in the course of normal operation of the computer system. What is preferred is that the contents of the dump record are worked through incrementally at a suitable rate in parallel with any 'emergency' page dumps triggered by the computer system wanting to perform an operation on one of the pages that has not yet been dumped. The incremental dumping of pages that are part of the data image may for example take account of system load, and so be performed when the system is operating below a certain load factor. The incremental dumping may also be scheduled according to a system parameter that requires the dump to be completed within a certain amount of time from when the dump request was raised, or by a certain time of day.

With reference to FIG. 4, on receipt of a data dump request to record a data image, the computer system, e.g., via its operating system, temporarily suspends normal computer operations, such as running of applications to prevent any uncontrolled changes to memory contents before the data dump request has been initially processed.

The initial processing of the data dump request during this temporary suspension of normal operations is as depicted in FIG. 4. The computer system writes to a dump storage the volatile memory contents required for the data image, namely the register contents and the physical core memory contents. The register contents are written to the dump dataset via the intermediate step of a read of the register contents by the physical core memory. The computer system also prepares a record of the address pages in the non-volatile memory part of the virtualized address space whose contents is still to be written to the dump storage as part of the data image. The computer system then starts a monitoring process before lifting the suspension of normal operations, so that normal operations restart under supervision of the monitoring process.

The subsequent processing of the data dump request after resumption of normal operations under supervision of the monitoring process is as depicted in FIG. 5. Namely, the remaining pages in the non-volatile memory needed to complete the dump are progressively read into physical core memory and then written to the dump dataset before they are, or can be, modified in the course of normal computer operations.

The function of the monitoring process is two-fold. Firstly, it checks page requests to access non-volatile memory to trap any requests that relate to a page contained in the dump record whose contents is still to be written to the dump storage. If such a trap occurs, the monitoring process further ensures that the contents of that page is written to the dump data set before any modification can occur of what is stored at that page in the non-volatile memory. We call this 'emergency' dumping. Secondly, in parallel to carrying out 'emergency' dumps, the monitoring process progresses the data dump incrementally by reading pages that are yet to be dumped, as known from the dump record, from non-volatile memory and writing to the dump storage the contents of these pages. We call this 'incremental' dumping. While this second function is not absolutely technically necessary to ensure the dump request is fulfilled, in a usual practical setup it will be needed to ensure that dump requests are completed reasonably quickly. With each dump, whether emergency or incremental, the monitoring process ensures that the dump record is kept up to date, by logging each time the contents of a page that is logged in the dump record has been written to the dump storage. In that way, the monitoring process keeps track of which pages are still to be written to the dump storage until the data dump of the data image is complete. Finally, once all elements of the data image have been saved to the dump storage, the monitoring process can be stopped, i.e., the supervision of normal operation can cease.

Figure 6:
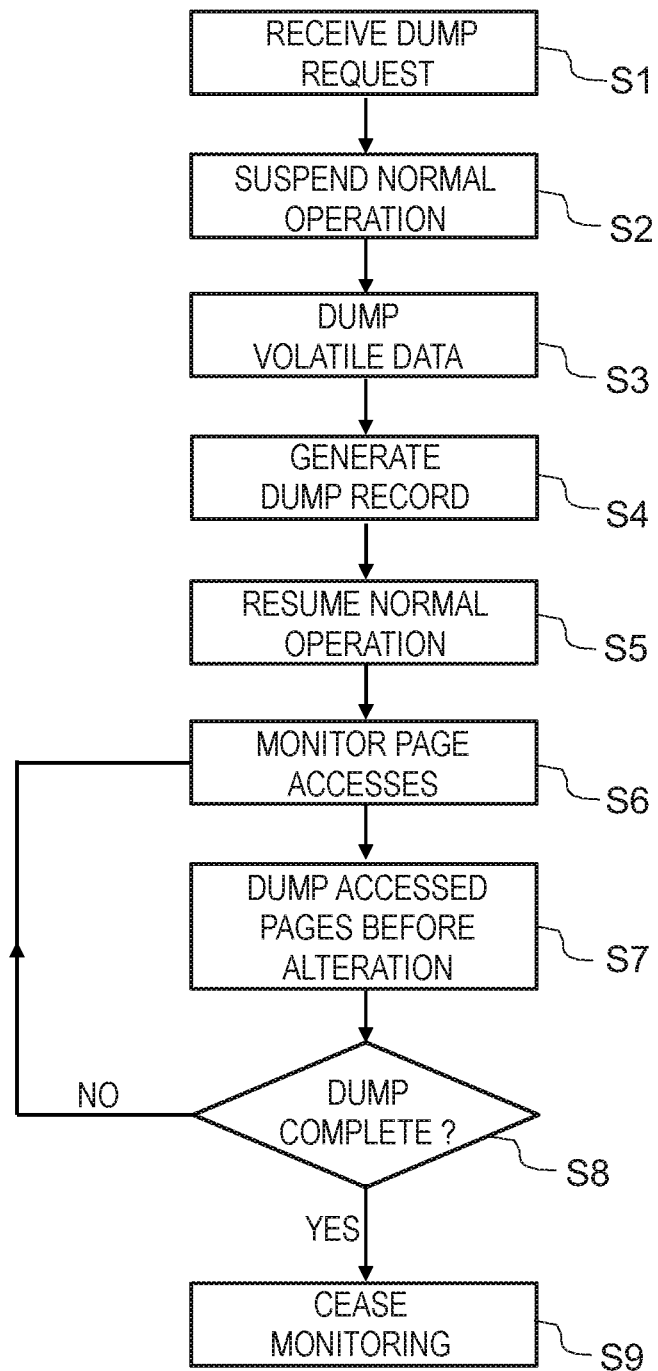
FIG. 6 is a flow diagram of a data dump from a computer system with a virtualized address space, in accordance with one embodiment of the present invention.

FIG. 6 is a flow diagram which summarizes the above description of a process for performing a data dump from a computer system with a virtualized address space, in accordance with one embodiment of the present invention as also illustrated in FIG. 4 and FIG. 5.

The process starts when a dump request to record a data image is received as shown at Step S1. In response to receipt of the data dump request, at Step S2, the operating system or other control program acts to suspend normal operations of the computer system, i.e., any operations that may result in the data image being corrupted. While the suspension is in place, the process proceeds to Step S3 in which the data for the data image that resides in volatile memory is written to, i.e., saved in, a dump storage. The volatile memory contents of the data image are thus secured. With the suspension still in place, the process at Step S4 prepares a record of the addresses in the virtualized address space whose contents is still to be written to the dump storage as part of the data image. It will be understood that the relative order of Steps S3 and S4 is unimportant and indeed the two may also be carried out in parallel.

The next step is Step S5 which lifts the suspension and resumes normal computer system operations under supervision of a monitoring process put in place to manage completion of the servicing of the dump request in respect of the non-volatile memory contents. The monitoring of page access requests to the non-volatile memory takes place at Step S6. If the monitoring at Step S6 identifies, i.e., traps, an access request relating to an address that is contained in the dump record and which is still to be written to the dump storage, e.g., a specific page, then at Step S7, the contents of that page are loaded into the volatile memory as normal, but then immediately written to the dump storage space, i.e., saved to the dump storage, before there is any ability of the computer system to modify that data.

At Step S8, the dump record is checked to see if the dump is now complete. If it is, then the monitoring process can be ceased, as shown at Step S9. If it is not, then monitoring continues. The dump completion check of Step S8 may be carried out each time there is a write to the dump storage, or more occasionally, e.g., in fixed time intervals configured by the user.

Figure 7:
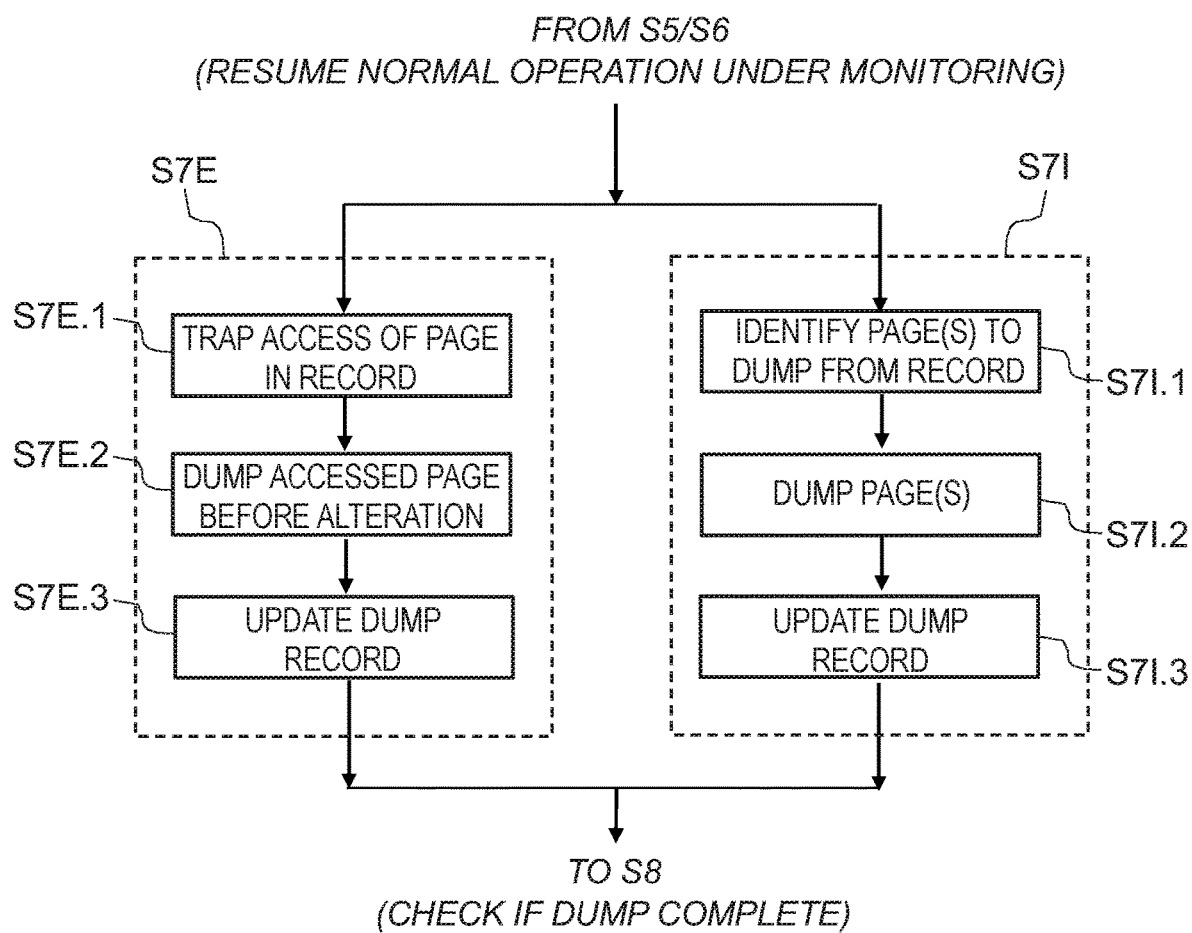
FIG. 7 shows more details of the process flow shown in FIG. 6 in respect of dumping non-volatile data, in accordance with one embodiment of the present invention.

More details involved in implementing the dump of the non-volatile memory contents are shown in FIG. 7. The dump of the non-volatile memory contents has two sub-processes that run independently and in parallel. There is one sub-process labeled Step S7E which is triggered by traps of page access requests to ensure that data in those pages is dumped before it can be altered. Here the "E" stands for emergency. There is another sub-process labeled Step S71 which relates to the system working through the pages marked in the dump record, so that they are dumped to the dump storage. Here the "I" stands for incremental.

The emergency sub-process includes Step S7E.1 trapping an access of a page by the system which is contained in the dump record (and also marked in the dump record as still needing to be dumped). At Step S7E.2, the accessed page is loaded into volatile memory and then saved to the dump storage before it can be modified. At Step S7E.3, the dump record is updated to reflect the fact that the page has now been saved to the dump storage. The updating might be to delete the entry in the record that relates to that page, or to unset (or set) a flag in the record to show that the page is now dumped.

The incremental sub-process S71 includes Step S71.1 identifying a page or group of pages in the dump record to write to the dump storage. At Step S71.2, those pages are then loaded into volatile memory and written to the dump storage. The dump record is then updated accordingly at Step S71.3. As already discussed above, the incremental sub-process may be given flexible priority by applying a set of criteria, such as one or more computer system performance criteria, and may be paused at times of high system load, for example. Some embodiments may even not include the incremental sub-process, as also mentioned above, so the dump relies exclusively on the emergency sub-process.

While the method has been described as saving the volatile memory data during the initial, temporary suspension of normal operations and the non-volatile memory after restart of normal operations, it will be understood that some of the non-volatile memory contents could also be stored during the suspension if desired, e.g. selected pages thereof known to be stored in low latency (i.e. high speed access) non-volatile memory.

The proposed technology could be implemented as an enhancement to a processor/hardware architecture (e.g. an existing architecture such as IBM z/OS) to enable memory pages to be written directly to a dump when a page is loaded into physical core memory before it is updated or altered.

The proposed method and apparatus allows for an incremental dump to take place and is able to reduce significantly the impact on system performance compared with a conventional approach where a full dump is needed before the system can resume undertaking normal tasks. The incremental dump is performed in a way that ensures there is no loss of data integrity within the completed dump by dumping the volatile memory contents initially and then dumping the non-volatile memory contents incrementally while watching out for any reads by the volatile memory of pages in the non-volatile memory that relate to contents that still need to be dumped, so that the contents of these pages is dumped before there is any risk of them being altered. The proposed method is specific to a virtual address space, since the monitoring process snoops on page swaps, i.e., the process by which pages of virtual memory are loaded into and out of physical core memory as required. The fact that an operating system for a computer with a virtual address space will be notified whenever a page is loaded into physical core memory is exploited by the proposed method to provide an efficient mechanism for intercepting page reads and thus triggering outstanding page dumps as described above.

It will be clear to one of ordinary skill in the art that all or part of the logical process steps of the preferred embodiment may be alternatively embodied in a logic apparatus, or a plurality of logic apparatus, comprising logic elements arranged to perform the logical process steps of the method and that such logic elements may comprise hardware components, firmware components or a combination thereof.

It will be equally clear to one of skill in the art that all or part of the logic components of the preferred embodiment may be alternatively embodied in logic apparatus comprising logic elements to perform the steps of the method, and that such logic elements may comprise components such as logic gates in, for example, a programmable logic array or application-specific integrated circuit. Such a logic arrangement may further be embodied in enabling elements for temporarily or permanently establishing logic structures in such an array or circuit using, for example, a virtual hardware descriptor language, which may be stored and transmitted using fixed or transmittable carrier media.

In a further alternative embodiment, the present invention may be realized in the form of a computer implemented method of deploying a service comprising steps of deploying computer program operable to, when deployed into a computer infrastructure and executed thereon, cause the computing device to perform all the steps of the method.

It will be appreciated that the method and components of the preferred embodiment may alternatively be embodied fully or partially in a parallel computing system comprising two or more processors for executing parallel software.

A further embodiment of the disclosure is a computer program product defined in terms of a system and method. The computer program product may include a computer-readable storage medium (or media) having computer-readable program instructions thereon for causing a processor to carry out aspects of the present invention.

The computer-readable storage medium can be a tangible device that can retain and store instructions for use by an instruction execution device.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (for example light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 8:
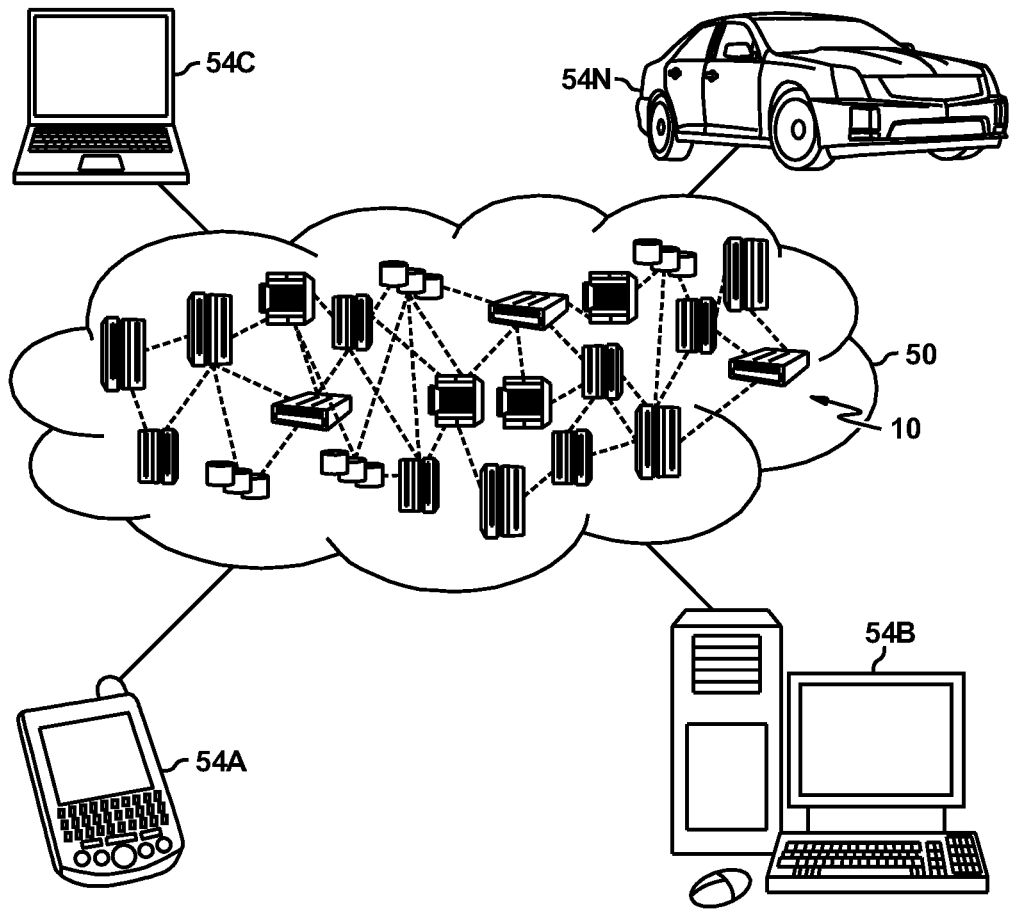
FIG. 8 illustrates a cloud computing environment in which embodiments of the disclosure may be implemented, in accordance with one embodiment of the present invention.

Referring now to FIG. 8, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 8 are intended to be illustrative only and that computing nodes 10 and cloud computing environment 50 can communicate with any type of computerized device over any type of network and/or network addressable connection (e.g., using a web browser).

Figure 9:
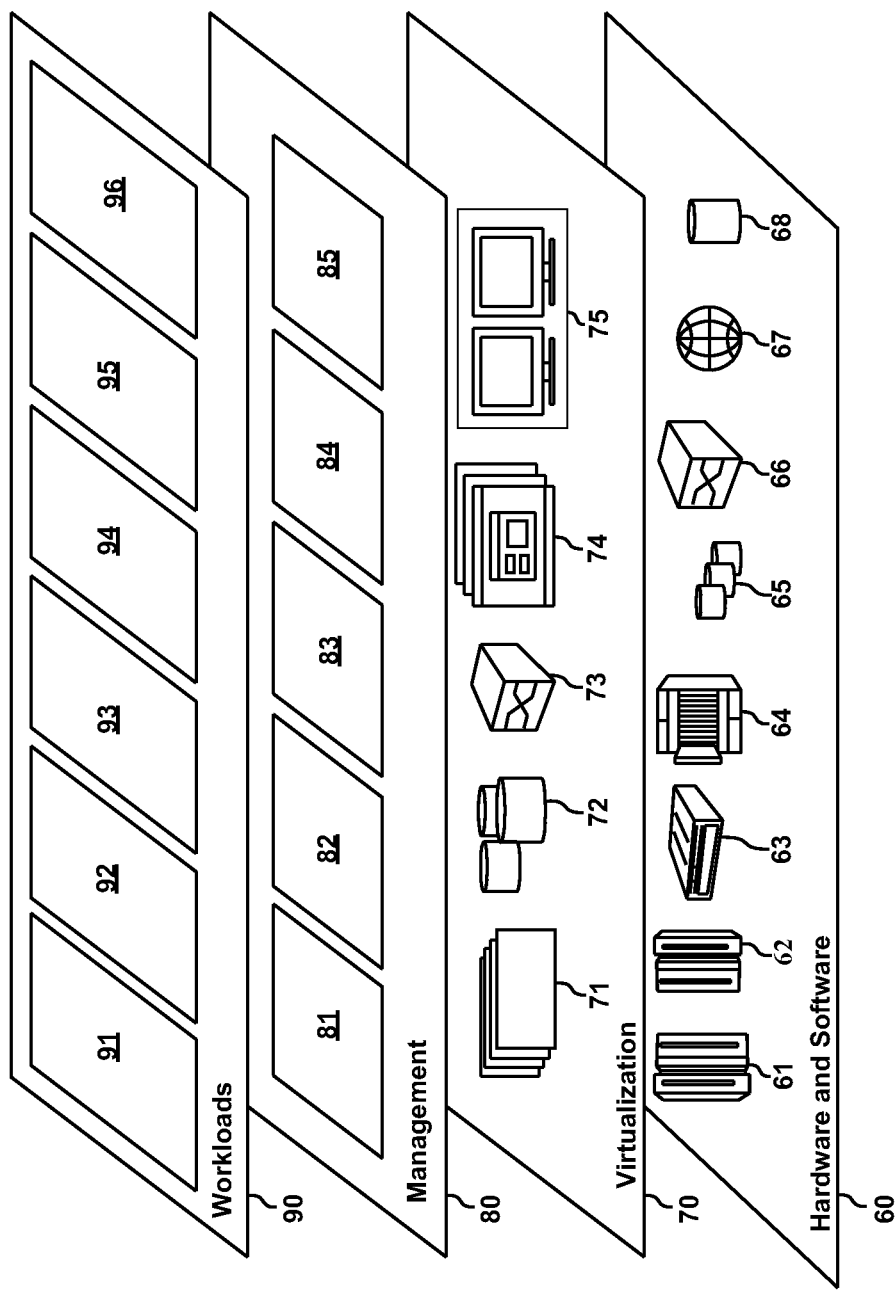
FIG. 9 shows a set of functional abstraction layers provided by the cloud computing environment of FIG. 8, in accordance with another embodiment of the present invention.

Referring now to FIG. 9, a set of functional abstraction layers provided by cloud computing environment 50 (FIG. 8) is shown. It should be understood in advance that the components, layers, and functions shown in FIG. 9 are intended to be illustrative only and embodiments of the disclosure are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software lifecycle management 92; virtual classroom education delivery 93; data analytics processing 94; transaction processing 95; and a process for servicing a data dump request 96 according to embodiments of the disclosure.

It will be clear to one skilled in the art that many improvements and modifications can be made to the foregoing exemplary embodiment without departing from the scope of the present disclosure.

What is claimed is:

1. A computer-implemented method for operating a computer system to carry out a data dump of a data image of memory contents, the method comprising:
in response to receipt of a data dump request to record a data image, suspending operations of the computer system that results in the data image being corrupted;
writing to a dump storage a subset of the pages required for the data image, including contents of the data image in the volatile memory;
preparing a record of the pages in the virtualized address space whose contents is still to be written to the dump storage as part of the data image;
resuming operations of the computer system under supervision of a monitoring process;
wherein the monitoring process includes checking page requests to access non-volatile memory to trap any that relate to a page contained in the record which is still to be written to the dump storage, and upon such a trap ensuring contents of the page is written to the dump storage space before any modification occurs; and
wherein the monitoring process further includes continually updating the record to keep track of which pages are still to be written to the dump storage.

2. The computer-implemented method of claim 1, wherein, when a computer operation involves a read request to the page in the record that is still to be written to the dump storage, reading the page from the non-volatile memory into the volatile memory, writing contents of the page to the dump storage, and updating the record.

3. The computer-implemented method of claim 1, wherein, when a computer operation involves a write request to the page in the record that is still to be written to the dump storage, reading that page from the non-volatile memory into the volatile memory, writing contents of the page to the dump storage before overwriting the page in fulfillment of the write request, and updating the record.

4. The computer-implemented method of claim 1, wherein the computer system has a processor with a plurality of registers and the method further comprises writing contents of the registers to the dump storage while operations of the computer system are suspended.

5. The computer-implemented method of claim 1, wherein the monitoring process further comprises:
progressing the data dump by incrementally reading the pages in the record from the non-volatile memory and writing contents of the pages to the dump storage.

6. The computer-implemented method of claim 5, wherein the incremental reading from the non-volatile memory and writing to the dump storage is carried out at a rate determined by a policy, wherein the policy includes at least one factor relating to computer system performance and at least one factor relating to speed of completion of the data dump.

7. The computer-implemented method of claim 5, wherein the incremental reading from the non-volatile memory and writing to the dump storage is carried out at a rate sufficient to ensure that the data dump of the data image is completed within a target time.

8. The computer-implemented method of claim 5, wherein the incremental reading from the non-volatile memory and writing to the dump storage is carried out at a rate adjusted with reference to a computer system performance criterion.

9. The computer-implemented method of claim 1, wherein the data dump request is specific to a particular computer application running on the computer system, and is carried out by identifying, during the temporary suspension, those pages in the non-volatile memory that are specific to the computer application, so that the record only need contain those specific pages.

10. The computer-implemented method of claim 1, wherein the non-volatile memory comprises a lower latency portion which is part of the computer system and a higher latency part which is external to the computer system.

11. The computer-implemented method of claim 1, wherein the record is made up by setting a plurality of page-specific flags, each flag being unset when the contents from the page have been written to the dump storage.

12. A computer program product for operating a computer system to carry out a data dump of a data image of memory contents, the computer program product comprising one or more computer-readable tangible storage devices and program instructions stored on at least one of the one or more computer-readable tangible storage devices, the program instructions executable to:
in response to receipt of a data dump request to record a data image, suspend operations of the computer system that results in the data image being corrupted;
write to a dump storage a subset of the pages required for the data image, including contents of the data image in the volatile memory;
prepare a record of the pages in the virtualized address space whose contents is still to be written to the dump storage as part of the data image;
resume operations of the computer system under supervision of a monitoring process;
wherein the monitoring process includes checking page requests to access non-volatile memory to trap any that relate to a page contained in the record which is still to be written to the dump storage, and upon such a trap ensuring contents of the page is written to the dump storage space before any modification occurs; and
wherein the monitoring process further includes continually updating the record to keep track of which pages are still to be written to the dump storage.

13. The computer program product of claim 12, further comprising the program instructions the monitoring process, executable to:
progress the data dump by incrementally reading the pages in the record from the non-volatile memory and writing contents of the pages to the dump storage.

14. The computer program product of claim 12, wherein, when a computer operation involves a read request to the page in the record that is still to be written to the dump storage, reading the page from the non-volatile memory into the volatile memory, writing contents of the page to the dump storage, and updating the record.

15. The computer program product of claim 12, wherein, when a computer operation involves a write request to the page in the record that is still to be written to the dump storage, reading that page from the non-volatile memory into the volatile memory, writing contents of the page to the dump storage before overwriting the page in fulfillment of the write request, and updating the record.

16. The computer program product of claim 12, wherein the computer system has a processor with a plurality of registers and the method further comprises writing contents of the registers to the dump storage while operations of the computer system are suspended.

17. A computer system for operating a computer system to carry out a data dump of a data image of memory contents, the computer system comprising:
one or more processors, one or more computer readable tangible storage devices, and program instructions stored on at least one of the one or more computer readable tangible storage devices for execution by at least one of the one or more processors, the program instructions executable to:
in response to receipt of a data dump request to record a data image, suspend operations of the computer system that results in the data image being corrupted;
write to a dump storage a subset of the pages required for the data image, including contents of the data image in the volatile memory;
prepare a record of the pages in the virtualized address space whose contents is still to be written to the dump storage as part of the data image;
resume operations of the computer system under supervision of a monitoring process;
wherein the monitoring process includes checking page requests to access non-volatile memory to trap any that relate to a page contained in the record which is still to be written to the dump storage, and upon such a trap ensuring contents of the page is written to the dump storage space before any modification occurs; and
wherein the monitoring process further includes continually updating the record to keep track of which pages are still to be written to the dump storage.

18. The computer system of claim 17, further comprising the program instructions the monitoring process, executable to:
progress the data dump by incrementally reading the pages in the record from the non-volatile memory and writing contents of the pages to the dump storage.

19. The computer system of claim 17, wherein, when a computer operation involves a read request to the page in the record that is still to be written to the dump storage, reading the page from the non-volatile memory into the volatile memory, writing contents of the page to the dump storage, and updating the record.

20. The computer system of claim 17, wherein, when a computer operation involves a write request to the page in the record that is still to be written to the dump storage, reading that page from the non-volatile memory into the volatile memory, writing contents of the page to the dump storage before overwriting the page in fulfillment of the write request, and updating the record.

* * * * *